(12) United States Patent
Ueda

(10) Patent No.: US 8,465,811 B2
(45) Date of Patent: Jun. 18, 2013

(54) METHOD OF DEPOSITING FILM BY ATOMIC LAYER DEPOSITION WITH PULSE-TIME-MODULATED PLASMA

(75) Inventor: Shintaro Ueda, Tama (JP)

(73) Assignee: ASM Japan K.K., Tokyo (JP)

(*) Notice: Subject to any disclaimer, the term of this patent is extended or adjusted under 35 U.S.C. 154(b) by 175 days.

(21) Appl. No.: 13/016,735

(22) Filed: Jan. 28, 2011

(65) Prior Publication Data

US 2012/0196048 A1 Aug. 2, 2012

(51) Int. Cl.
*C23C 16/56* (2006.01)
*C23C 16/515* (2006.01)

(52) U.S. Cl.
USPC ............ 427/569; 427/578; 427/579; 427/584

(58) Field of Classification Search
None
See application file for complete search history.

(56) References Cited

U.S. PATENT DOCUMENTS

| | | | |
|---|---|---|---|
| 4,401,507 A | | 8/1983 | Engle |
| 6,825,134 B2 * | | 11/2004 | Law et al. ............... 438/788 |
| 7,745,346 B2 * | | 6/2010 | Hausmann et al. ......... 438/778 |
| 2003/0049375 A1 * | | 3/2003 | Nguyen et al. .......... 427/255.28 |
| 2005/0037154 A1 * | | 2/2005 | Koh et al. .................. 427/576 |
| 2005/0095770 A1 * | | 5/2005 | Kumagai et al. ........... 438/202 |
| 2009/0029528 A1 * | | 1/2009 | Sanchez et al. ............ 438/476 |
| 2009/0136683 A1 | | 5/2009 | Fukasawa et al. |

FOREIGN PATENT DOCUMENTS

| | | |
|---|---|---|
| JP | 03-044472 | 2/1991 |
| JP | 08-181135 | 7/1996 |
| JP | 2845163 | 1/1999 |

OTHER PUBLICATIONS

Wiley Interscience Publication by Lieberman and Lichtenberg, entitled "Principles of Plasma Discharges and Materials Processing", second edition, pp. 368-381.

* cited by examiner

Primary Examiner — Joseph Miller, Jr.
(74) Attorney, Agent, or Firm — Snell & Wilmer L.L.P.

(57) ABSTRACT

A thin film is formed by alternating multiple times, respectively, a process of adsorbing a precursor onto a substrate and a process of treating the adsorbed surface using a reactant gas and a plasma, wherein the reactant gas is supplied substantially uniformly over the substrate, and the plasma is pulse-time-modulated and applied in the process of supplying the reactant gas.

20 Claims, 5 Drawing Sheets

METHOD OF DEPOSITING FILM BY ATOMIC LAYER DEPOSITION WITH PULSE-TIME-MODULATED PLASMA

BACKGROUND

1. Field of the Invention

The present invention generally relates to a method of depositing a film by atomic layer deposition (ALD); particularly to a method of depositing a film by ALD with pulse-time-modulated plasma.

2. Description of the Related Art

Plasma Enhanced Atomic Layer Deposition (PE-ALD) is one of the plasma deposition processes. This method forms a film by repeating a process of adsorbing a precursor on a wafer and a process of treating the adsorbed precursor with a reactant gas plasma wherein the reactant gas plasma reacts the precursor adsorbed on the surface, thereby forming an atomic sub-layer on the wafer in each cycle of the repeating processes. To deposit a thick film, it requires a cyclic deposition of at least several hundred times, taking a long time to complete the deposition process. In the above, since plasma treatment is repeated at least several hundred times, surface potential on the wafer increases as a result of accumulating floating potential on the wafer, leading to the following risks: wafer slip, wafer sticking on a susceptor, and destruction of gate elect loads in a patterned wafer.

However, the above surface potential problems have not been recognized because PE-ALD predominantly targets a thin film and thus, it is believed that surface potential does not increase significantly on the wafer. Further, because PE-ALD is based on an equalization process of precursor adsorption and planar plasma treatment by a reactant gas, in-plane uniformity of a film is believed to be good. Thus, no solutions to the aforementioned problems have been provided. However, the present inventor expects that the problems will become more significant in the future because there is a demand for finer, more complex layered structures and patterns, and a combination with other layers and other treatments, wherein surface potential and in-plane uniformity of a film by PE-ALD may affect characteristics of a final product.

Technology to remove surface potential from a wafer is known in CVD, wherein amplitude-modulated RF power is applied, as a post-film formation process, after completion of film formation on the wafer (U.S. Patent Publication No. 2009/0136683). However, this technology is not suitable for PE-ALD because PE-ALD is a highly cyclic process, and surface potential accumulates at each cycle. Use of RF power having a pulse-time-modulation of 10 to 100 μsec for etching is known (Japanese Patent Laid-open No. H08-181135). However, such short pulse-time-modulation is used to alternately emit positive ions and negative ions to a wafer, thereby inhibiting accumulation of electrons and increasing etching speed, and this technology is unrelated to PE-ALD.

Any discussion of problems and solutions involved in the related art has been included in this disclosure solely for the purposes of providing a context for the present invention, and it should not be taken as an admission that any or all of the discussion were known at the time the invention was made.

SUMMARY

In at least one of the disclosed embodiments of the present invention, surface potential can effectively be controlled at each cycle during atomic layer deposition. In at least one of the disclosure embodiments, in-plane uniformity of a resultant film can significantly be improved. An embodiment of the present invention provides a method of forming a thin film by alternating multiple times, respectively, a process of adsorbing a precursor onto a substrate and a process of treating the adsorbed surface using a reactant gas and a plasma, wherein the reactant gas is supplied substantially uniformly over the substrate, and the plasma is pulse-time-modulated and applied in the process of supplying the reactant gas. In some embodiments, no reactant gas is supplied in the precursor adsorption process. In some embodiments, a purge process is provided between the precursor adsorption process and plasma treatment process using a reactant gas. In some embodiments, the pulse-time-modulated RF power is constituted by a plurality of pulses wherein one cycle of each pulse is about 3 msec to about 1,000 msec (typically about 100 msec to about 500 msec), and a duty of the cycle is about 60% or higher (typically about 75% or higher).

The disclosed embodiments include an embodiment providing a method of depositing a film by atomic layer deposition (ALD) with pulse-time-modulated plasma, comprising: (i) introducing a precursor gas in pulses over a substrate; (ii) introducing a reactant gas over the substrate; and (iii) applying pulse-time-modulated RF power in pulses onto the substrate, wherein a main pulse of the pulse-time-modulated RF power is applied onto the substrate during intervals between two consecutive pulses of the precursor gas while the reactant gas is being introduced, and no pulse of the pulse-time-modulated RF power is applied onto the substrate during the pulses of the precursor gas, wherein the main pulse of the pulse-time-modulated RF power is comprised of a plurality of secondary pulses wherein one cycle of each secondary pulse is about 3 msec to about 1,000 msec, and a duty of the cycle is about 60% or higher. In some embodiments, the reactant gas is introduced in pulses. In some embodiments, the main pulse of the pulse-time-modulated RF power has a duration of about 0.1 sec to about 10 sec (typically about 0.3 sec to 3 sec), and an interval between two consecutive main pulses of the pulse-time-modulated RF power is about 0.3 sec to about 5 sec (typically about 0.4 sec to about 3 sec). In some embodiments, one cycle of each secondary pulse is about 40 msec to about 600 msec. In some embodiments, the duty of the cycle of each secondary pulse is about 75% or higher.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DESCRIPTION OF EMBODIMENTS

In this disclosure, "gas" may include vaporized solid and/or liquid and may be constituted by a mixture of gases. In this disclosure, a film "having Si—N bonds", "having Si—O bonds", and "having Si—C bonds" may respectively refer to a film being characterized by Si—N bonds, Si—O bonds, and Si—C bonds, being constituted mainly or predominantly by Si—N bonds, Si—O bonds, and Si—C bonds, being categorized in Si—N films, Si—O films, and Si—C films, and/or having a main skeleton substantially constituted by Si—N bonds, Si—O bonds, and Si—C bonds, although elements such hydrogen, oxygen, nitrogen, and carbon other than in the respective bonds can be included in the film. In this disclosure, the reactive gas, the additive gas, and the precursor may be different from each other or mutually exclusive in terms of gas types, i.e., there is no overlap of gases among these categories. Further, in this disclosure, any ranges indicated may include or exclude the endpoints.

In the disclosure, "substantially smaller", "substantially different", "substantially less" or the like refers to a difference of at least 1%, 5%, 10%, 20%, 30%, 40%, 50%, 60%, 70%, 80%, or any ranges thereof, for example. Also, in the disclosure, "substantially the same", "substantially uniform", or the like refers to a difference of less than 10%, less than 5%, less than 1%, or any ranges thereof, for example.

In some embodiments, one cycle is measured from a pulse of the precursor gas to a next pulse of the precursor gas. In some embodiments, one cycle includes a main pulse of pulse-time-modulated RF power. In some embodiments, the main pulse of the pulse-time-modulated RF power is applied onto the substrate during intervals between two consecutive pulses of the precursor gas while the reactant gas is being introduced, and no pulse of the pulse-time-modulated RF power is applied onto the substrate during the pulses of the precursor gas. In some embodiments, the reactant gas can be introduced in pulses or continuously. In some embodiments, a purge gas is introduced in pulses or continuously. The purging process is effective in order to minimize the pressure changes when changing the atmosphere and/or changing the pressure in the reaction chamber, so that in-plane uniformity can be improved. In some embodiments, no purge gas is used, and instead, a vacuuming or evacuation process is used, for example, when in-plane uniformity may not suffer.

Figure 2:
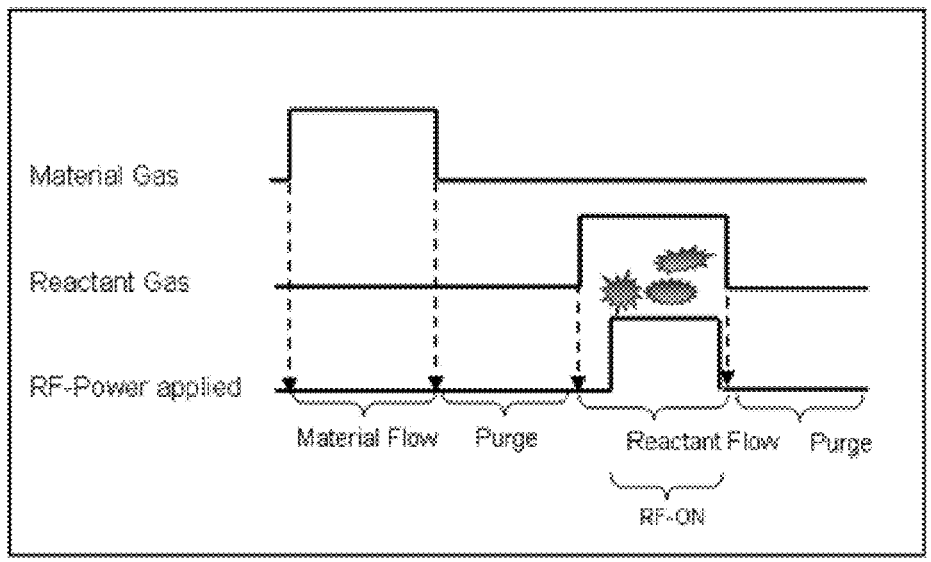
FIG. 2 illustrates a process sequence of comparative PE-ALD.
Figure 3:
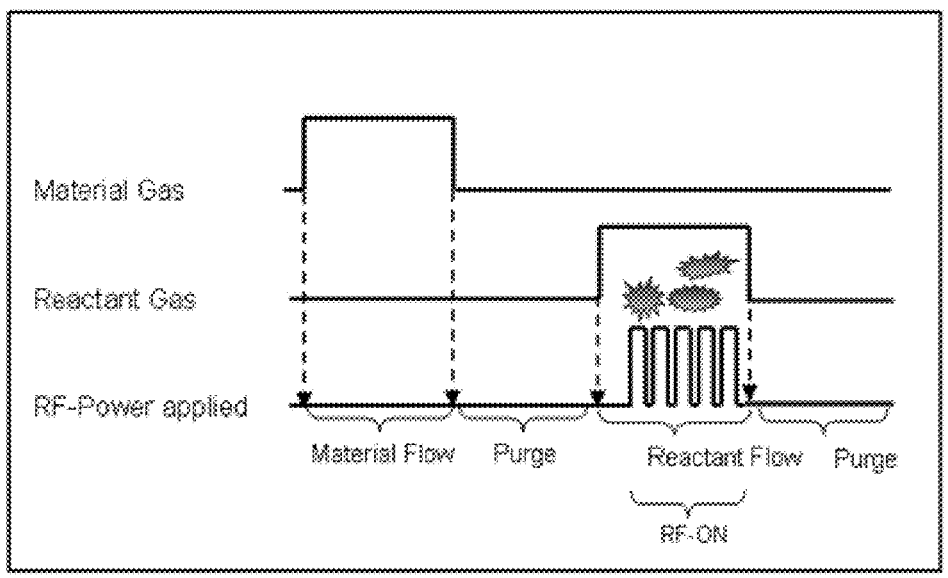
FIG. 3 illustrates a process sequence according to an embodiment of the inventive PE-ALD.

FIG. 2 illustrates a process sequence of comparative PE-ALD, whereas FIG. 3 illustrates a process sequence according to an embodiment of the inventive PE-ALD. The process sequence of comparative PE-ALD illustrated in FIG. 2 is similar to conventional PE-ALD. In FIG. 2, first, a precursor gas (material gas) flows in a pulse, followed by purging, and then, a reactant gas flows in a pulse, followed by purging, wherein RF power is applied during the pulse of the reactant gas flow. The RF power is applied about 0.1 sec to about 10 sec after the start of the reactant gas flow so that the reactant gas is distributed substantially evenly over the substrate prior to the application of the RF power. Thereafter, the reaction gas flows substantially evenly over the substrate. The above sequence constitutes one cycle, and the cycle is repeated several to hundreds times to form a film having a desired thickness. As a result of numerous applications of RF power, surface potential is accumulated on the depositing film. In FIG. 3, the RF power is pulse-time-modulated. Due to the pulse-time modulation of the RF power, surface potential can effectively be reduced at each cycle, inhibiting accumulation of floating potential over the substrate having a desired thickness (e.g., about 10 nm to about 1,000 nm). In addition, due to the pulse-time modulation of the RF power, in-plane uniformity of a film can substantially be improved. Dissimilar to film formation by PE-CVD wherein plasma reaction occurs in a space above the substrate and reaction products or particles deposit on the substrate, PE-ALD is based on surface reaction between the adsorbed precursor and the reactant gas with a plasma, and thus, a skilled artisan would not expect pulse-time modulation of RF power contributes to substantial improvement on in-plane uniformity of a film.

Figure 4:
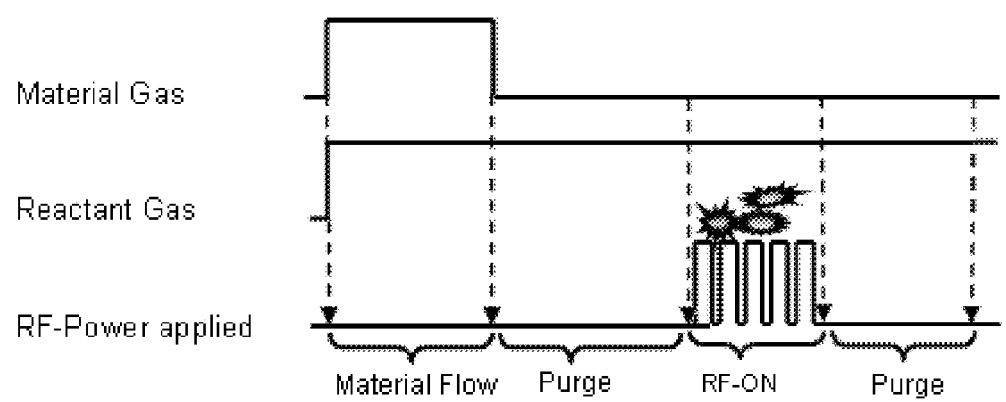
FIG. 4 illustrates a process sequence according to another embodiment of the inventive PE-ALD.

In some embodiments, the reactant gas flows constantly as shown in FIG. 4. In the embodiments, the reactant gas can be used as a purge gas.

In some embodiments, a duration of a precursor pulse overlapping no RF main pulse or no reactant gas pulse may be in a range of about 0.2 seconds to about 5 seconds (typically about 0.3 second to about 3 seconds), a duration of a reactant gas pulse overlapping an RF main pulse may be in a range of about 0.2 seconds to about 5 seconds (typically about 0.3 seconds to about 3 seconds), and an interval between the duration of the precursor pulse overlapping no RF main pulse and the duration of the reactant gas pulse overlapping an RF main pulse may be in an range of 0.2 seconds to about 5 seconds (typically about 0.3 second to about 3 seconds). The interval serves as a purge. In some embodiments, a purge gas and a reactant gas (in some embodiments, the reactant gas can serve also as the purge gas) are introduced continuously, wherein an interval between the duration of the precursor pulse overlapping no RF main pulse and the duration of an RF main pulse may be in an range of 0.3 seconds to about 5 seconds (typically about 0.4 second to about 4 seconds). In some embodiments, a duration of an RF main pulse may be in an range of about 0.1 seconds to about 10 seconds (typically about 0.3 seconds to about 5 seconds).

The precursor gas pulse can be created either by using a carrier gas to carry a vaporized precursor and introducing the mixture gas in pulses, or by constantly introducing a carrier gas and adding a vaporized precursor to the carrier gas in pulses.

The RF main pulse is constituted by a plurality of secondary pulses, i.e., is pulse-time-modulated, wherein one cycle of each secondary pulse is about 3 msec to about 1,000 msec (typically about 40 msec to about 600 msec, or about 100 msec to about 500 msec), and a duty of the cycle is about 60% or higher (typically about 75% or higher, or about 90% or higher).

The response characteristics of commercially available RF sources are approximately less than 2 msec in the beginning of operation, and the minimum cycle of pulse-time-modulated RF power with a duty of 75% during normal operation is approximately 8 msec, for example. In that example, the above means that a duration of RF-ON(RF power is activated)

is 6 msec, whereas a duration of RF-OFF (RF power is not activated) is 2 msec. In that case, if a duration of RF applying time period is 2 sec in one main cycle (constituted by one main pulse of the precursor or RF power), and if the duration of one secondary or time-modulated cycle (which defines pulse-time-modulation) is 8 msec, afterglow occurs approximately 250 times, thereby rebinding electrons and generating negative ions. Thus, by changing the time-modulated cycle of RF power, electric charges or floating potential can be reduced. Further, if the duty is the same, the total deposition time in one cycle of plasma enhanced ALD (PE-ALD) is the same, regardless of the duration of the time-modulated cycle. In some embodiments, the duration of the time-modulated cycle can be adjusted at as small a value as can be set. In some embodiments, more typically, the cycle of each secondary pulse is about 8 msec to about 1,000 msec. During the time-modulated cycles, no gas flow needs to be pulsed.

In PE-ALD, throughput is slow, and thus, any factors which prolong the process are ideally removed. For this purpose, it is preferable to set a duty at as long a value as is practical. It is also preferable to set a duration of RF-OFF in a time-modulated cycle at as short a value as is practical. However, the duration of RF-OFF in a time-modulated cycle is related to generation of negative ions from reaction gas species, and thus, the duration of RF-OFF should be long enough to generate and utilize as much of the negative ions as possible.

Figure 5:
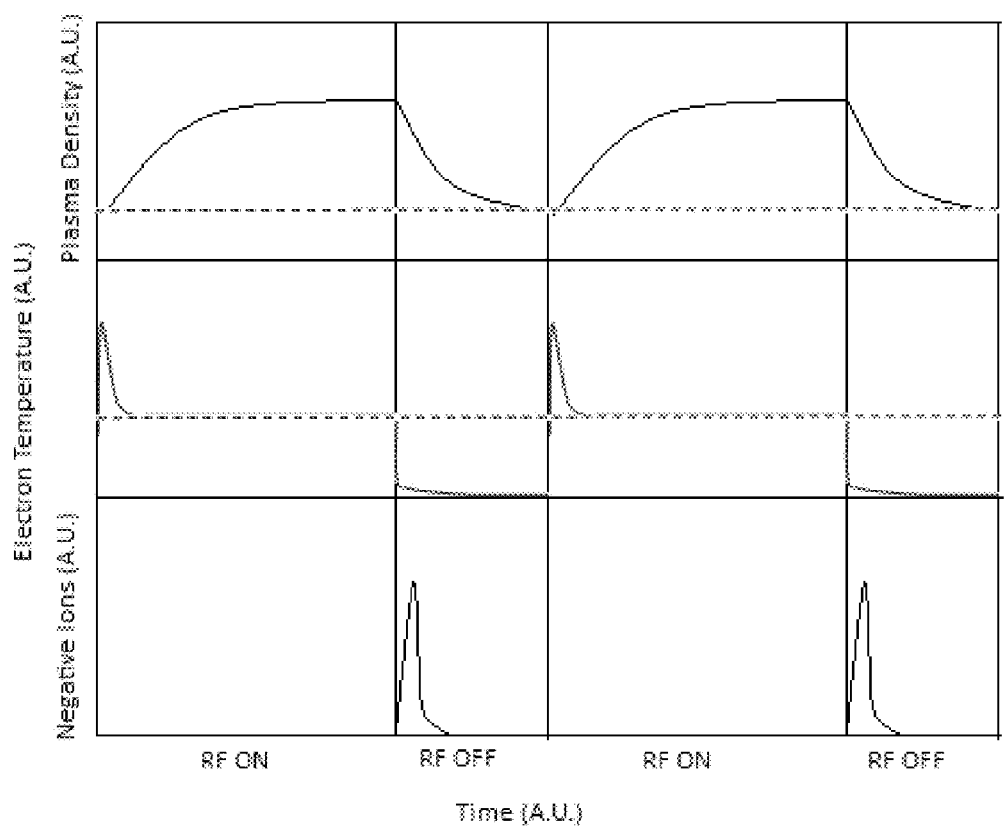
FIG. 5 schematically illustrates changes of plasma density, electron temperature, and negative ions in a time-modulated RF cycle (in solid lines), and in a continuous RF application (in broken lines).

For example, FIG. 5 schematically illustrates changes of plasma density, electron temperature, and negative ions in a time-modulated RF cycle (in solid lines) wherein RF power is ON(RF power is activated) and then OFF (RF power is stopped) and in a continuous RF application (in broken lines). As shown in FIG. 5, upon termination of RF power, negative ions are vigorously generated, and the amount of negative ions increases and quickly reaches a peak and then sharply reduces to nearly zero. Thus, the period of RF-OFF in a time-modulated cycle is set preferably to reduce the negative ions until the amount of negative ions decreases to zero, to gradually reduce the plasma density to the same level as that in a continuous RF application, and to sharply reduce the electron temperature to zero. In some embodiments, the duration of RF-OFF can be as short as 1 msec. In some embodiments, the duration of RF-OFF is about 1 msec to about 300 msec, or about 30 msec to 150 msec. For example, if the duration of RF-OFF is 3 msec, and a duty is 75%, the duration of one time-modulated cycle is 12 msec, i.e., if the duration of one main cycle is 2.0 sec, negative ions can be generated 1667 times. Phenomena similar to the above were reported in Japanese Patent Laid-open No. H08-181125 (the disclosure of which is incorporated by reference with respect to the measuring methods of negative ions).

Also as shown in FIG. 5, in some embodiments, the duration of RF-ON in a time-modulated cycle (i.e., RF power secondary pulse) is set to obtain high plasma density and high electron temperature, and to maintain a higher plasma density than that in a continuous RF application (in a broken line) and sharply reduce the electron temperature and maintain substantially the same electron temperature as that when in the continuous RF application (in a broken line). In some embodiments, the duration of RF-ON in a time-modulated cycle is about 3 msec to about 900 msec, or about 90 msec to 450 msec. Phenomena similar to the above were reported in M. A. Lieberman, A. J. Lichtenberg: Principles of plasma discharges and materials processing, Second Edition, John Wiley & Sons, Inc. New Jersey, pp 369-380 (the disclosure of which is incorporated by reference with respect to the measuring methods of plasma density and electron temperature).

A skilled artisan would be readily able to modify the main cycle of RF power and the time-modulated cycle of RF power based on generation of negative ions, plasma density, and/or electron temperature, depending on the type of precursor gas, reactant gas, etc., and this disclosure.

An embodiment provides a method of forming a thin film, such as an insulation film, dielectric film, hard mask, diffusion barrier film, or conductive film, by alternating multiple times, respectively, a process of adsorbing a precursor onto a substrate and a process of treating the adsorbed surface using a reactant gas and a plasma, wherein a plasma is pulse-time-modulated and applied in the process of supplying the reactant gas. In some embodiments, a reactant gas is not supplied in the precursor adsorption process. This is because the reactivity of precursor and reactant gas is high, and such high reactivity may result in generation of particles. In some embodiments, a purge process is provided between the precursor adsorption process and plasma treatment process using a reactant gas. In some embodiments, the precursor is at least one type of material selected from the group that includes silicon. In some embodiments, the insulation film is constituted by a silicon compound. In some embodiments, the reactant gas is $NO_2$, $O_2$, $H_2$, $CO_2$, $N_2O$, $N_2$ and/or $NH_3$. In some embodiments, the film is constituted by SiO, SiN, SiC, SiON, SiCON, SiCO, SiBN, SiBO or SiCN. In some embodiments, the compound containing silicon has an aminosilane group. In some embodiments, the insulation film is constituted by a metal oxide compound or metal oxide composite such as a metal amid. In some embodiments, the insulation film is constituted by MO, MN, MC, MON, MCON, MCO, MBN, MBO and/or MCN, wherein M is a transition metal such as Ti, W, Ge, or As.

In some embodiments, a reactant gas is also supplied in the precursor adsorption process. Supplying a reactant gas during all times can improve thru-put, and it does not need reactant purge time, and thus, cycle time can be shortened. In some instances, it can improve the film growth rate. However, simultaneous supply of the precursor and the reactant gas followed by plasma application causes the precursor and reactant gas to react in the gas phase. To cause adsorption reaction to occur as close as possible onto the surface, therefore, reaction in the gas phase should be suppressed to an appropriate degree. If reaction progresses excessively in the gas phase, the film growth rate will rise but the coverage will drop. The coverage depends on the RF power as well as concentrations of precursor and reactant gas. If the reactivity of precursor and reactant gas is high, however, supplying the two simultaneously may result in particle generation.

In some embodiments, no plasma power is applied in the precursor adsorption process. In some embodiments, the process pressures in the precursor adsorption process and plasma treatment process using a reactant gas are in a range of 50 to 2000 Pa (typically about 50 Pa to about 200 Pa). In some embodiments, radio frequency waves are applied to the gap between the parallel plate electrodes to generate a plasma. In some embodiments, the radio-frequency power applied in the plasma treatment process is 1 to 1,500 W, 1 to 1,000 W, or in some embodiments 500 W, 100 W, 80 W, 50 W, or 30 W (any ranges therebetween). In some embodiments, when the process temperature is relatively low such as room temperature to 200°, the power may be about 10 W to 200 W. In some embodiments, if the temperature is higher such as 200° C. to 400° C., the power may be about 200 W to about 500 W. For a SiN film, the power may be about 1,000 W in some embodiments. The above power values are for a substrate having a diameter of 300 mm (e.g., 40 W for a 300-mm substrate is 0.057 W/cm$^2$, whereas 400 W for a 300-mm substrate is 0.566

W/cm$^2$), and if the diameter is of 200 mm, the power can be changed proportionally, for example.

The range of how much reactant gas should be supplied, ratio of reactant gas and precursor gas and other conditions are according to the types of precursor and reactant gas. In some embodiments, the flow rate of a precursor depends on the flow rate of a carrier gas and is about 10 sccm to about 2,000 sccm, typically about 30 sccm to about 700 sccm as a mixture (this can be controlled by downstream pressure, e.g., about 10 kPa to about 100 kPa, by, e.g., an auto pressure regulator); the flow rate of reactant gas is about 10 sccm to about 1,000 sccm, typically about 100 sccm to about 400 sccm; the flow rate of inert or purge gas or seal gas is about 10 sccm to about 1,000 sccm, typically about 100 sccm to about 400 sccm. When 3DMAS is used as the precursor, representative ranges of reactant gas flow rates are 0 to 900 sccm for $N_2$; 0 to 500 sccm for $H_2$; and 0 to 300 sccm for $NH_3$ in an embodiment. If the material is 3DMAS-Cl, it reacts with $H_2$ in the gas phase to generate particles. Among these, $H_2$, for example, can be used effectively by supplying it in the reactant gas process, but not in the material supply process. As for $N_2$ gas, in an embodiment it makes little difference whether or not $N_2$ gas is supplied in the material supply process. In the case of $NH_3$, too much supply of $NH_3$ in the material supply process lowers the coverage in an embodiment. In an embodiment, the amount of material supply is estimated to be approx. 1 to 30 sccm.

In some embodiments, representative examples of temperature range, range of processing time and flow rate range of precursor are shown below. The temperature range is 500° C. or below in an embodiment where the base method is PEALD involving application of plasma. In the case of thermal ALD where a plasma is not applied, on the other hand, high temperatures of 500° C. or above are required. The use of plasma makes the temperature range of the process low, such as 500° C. or below. In addition, a representative temperature range is 200 to 400° C. in the case of SiN film. With SiO film, a representative temperature range is from room temperature to 400° C. Lower temperatures provide an advantage from the viewpoint of application requirements. As for processing time, representative settings are 0.1 to 10 sec in the material supply process, 0 to 2 sec during purge and 0.5 to 10 sec in the reactant gas supply process. RF is applied in the material supply process. Typically when 3DMAS is used as the material, 100 to 500 sccm of carrier gas is used and the flow rate of 3DMAS is estimated to be 1 to 30 sccm. The same applies when HEAD is used.

The processing time mentioned above refers to the time during which a precursor is supplied and radio frequency waves are applied.

In some embodiments, representative examples of temperature range, range of processing time and flow rate range of precursor for plasma treatment using a reactant gas are shown below. In an embodiment, only one plasma processing temperature is required regardless of the type of precursor adsorption process, where this one temperature is normally 500° C. or below or preferably 50 to 400° C. The plasma treatment time using a reactant gas is typically 0.1 to 10 sec. The flow rate of reactant gas is approx. 100 to 1000 sccm for $H_2$, $N_2$, or $O_2$, for example. The processing time mentioned above refers to the time during which a reactant gas is supplied and radio frequency waves are also applied.

In some embodiments, representative examples of type of gas, flow rate range of gas, range of purge processing time and pressure are shown below. In the purge process, precursor is not supplied but inert gas, such as Ar, is supplied by approx. 100 to 3000 sccm. A reactant gas may be used in the purge process in some embodiments. Typically the purge time is 0 to 2 sec, while the pressure is typically 200 to 500 Pa, or approx. 50 to 2000 Pa in other embodiments. Note that typically evacuation is not performed after the purge. The purge time above refers to the time during which the atmosphere is exhausted while gas is still being supplied.

In some embodiments, conversely a purge process may be provided in the same manner between the plasma treatment process using a reactant gas and the precursor adsorption process. However, this purge can be omitted in some cases. The chances of this purge being omitted without presenting problems are high, so long as all gases used in the plasma treatment process using a reactant gas and in the material adsorption process are the same, except for the material gas (es).

In some embodiments, desirably the RF power should be 100 W or less in the material supply process and 100 W or more when a plasma is applied under reactant gas. The plasma power in the reactant gas supply process is considered to affect the film quality primarily and film growth rate to some extent. Accordingly, the plasma power can be adjusted as deemed appropriate. In some embodiments, typically the radio frequency range is around 13.56 MHz or higher (high-frequency RF). In other embodiments, frequencies in a range of 400 kHz to 3 GHz (low-frequency RF) may be used. In some embodiments, a combination of high-frequency RF power and low-frequency RF power can be used.

In some embodiments, for a silicon-based dielectric film, HEAD ($Si_2[NHC_2H_6]_6$), 3DMASCl ($Si[N(CH_3)_2]_3Cl$), 3EMAS ($H_2Si[N(C_2H_5)CH_3]_3$), 4DMAS ($Si[N(C_2H_6)_2]_4$), 4DEAS ($Si[N(C_2H_6)_2]_4$) and other materials belonging to the aminosilane group can be used as the first material (precursor). Other materials that can be used include $SiH_4$, $Si_2H_6$, TSA ($[SiH_3]_3N$), HCDS ($Si_2Cl_6$), $Si_3H_8$, TICS ($Si[NCO]_4$), TBOS ($Si[OtBu]_3OH$), TDMHyS ($Si[NHMe_2]_4$), among others. In some embodiments, for a dielectric film constituted by a metal oxide compound or metal oxide composite, any suitable compounds replacing the silicon with a metal in the foregoing compounds can be used as the precursor. Only one type of precursor may be used alone, or two or more types may be used together simultaneously or sequentially.

In some embodiments, the reactant gas may be $N_2$, $H_2$, $O_2$, $NH_3$, $CH_3$, CO, $C_2H_6$, $CO_2$, $N_2O$, $B_2H_6$, etc. (only one type of reactant gas may be used alone, or two or more types may be combined together). Depending on the reactant gas(es) used, such films as SiN, SiO, SiON, SiCN, SiC, SiCO, SiCON, SiON, SiBN, SiBO, etc., can be formed.

In the present disclosure where conditions and/or structures are not specified, the skilled artisan in the art can readily provide such conditions and/or structures, in view of the present disclosure, as a matter of routine experimentation. Also, in the present disclosure, the numerical values applied in specific embodiments can be modified by a range of at least ±50% in other embodiments, and the ranges applied in embodiments may include or exclude the endpoints.

EXAMPLE

An embodiment of the present invention will be explained with reference to the following example which is not intended to limit the present invention.

Example 1

Figure 1:
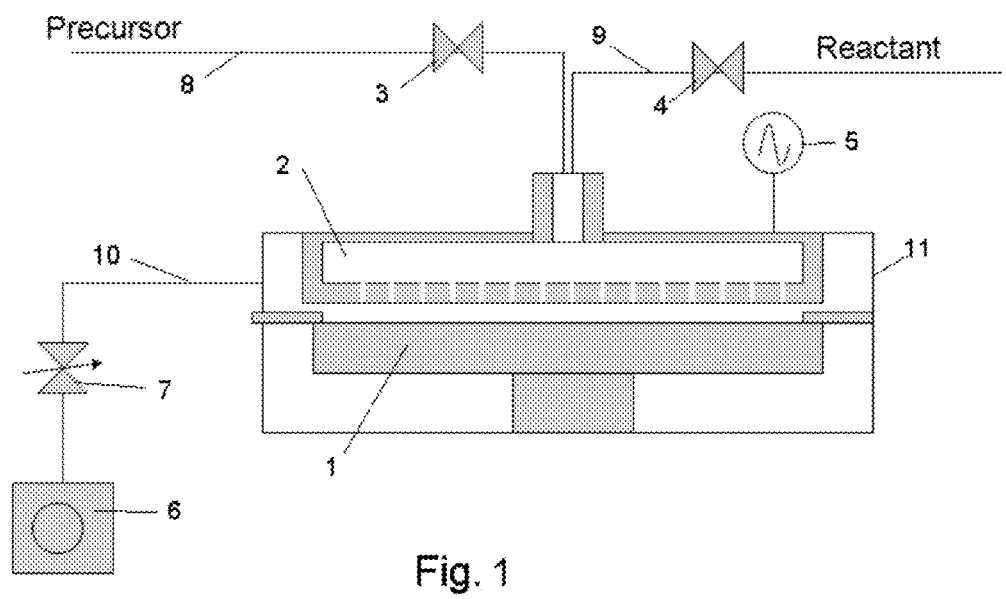
FIG. 1 is a schematic view of a PE-ALD apparatus usable in an embodiment of the present invention.

In this example, the apparatus shown in the schematic diagram of FIG. 1 was used to form a film. This apparatus comprises a reactor 11 which can be retained in a vacuum state, susceptor 1 with heating mechanism used to hold a single wafer on top, shower head 2 which provides a mechanism for supplying gas, RF application mechanism 5 that generates a pulse-time-modulated plasma between the shower head and susceptor, precursor gas supply line 8 equipped with an open/close valve 3 connected to the shower head 2, reactant gas supply line 9 equipped with another open/close valve 4, exhaust line 10 used to exhaust the atmosphere inside the reactor 11, and vacuum pump 6 connected after the exhaust line via a pressure control valve 7, among others. Note that a purge gas line (not illustrated) is also connected to the shower head 2 just like the reactant gas supply line 9.

A Si wafer (300 mm in diameter) was heated to 70° C., and then N,N,N',N'-tetraethylsilanediamine (SAM24) being the first material or precursor, Ar being the carrier gas, were introduced, with the pressure adjusted by an auto-pressure regulator to approx. 30 kPa. The precursor carrier gas (any gas can be used as long as it is inert; Ar was used in this example, but the carrier gas may be the same as or different from the purge gas) was set by a mass flow controller at a flow rate of 2.0 SLM upstream of a precursor tank (which resulted in a precursor and carrier gas flow rate of approx. 38 to 630 sccm depending on the set pressure of the auto pressure regulator). Ar seal gas was adjusted to a flow rate of 200 sccm and the pressure was constantly retained. The precursor was then supplied together with carrier gas (by precursor pulses) for 1.0 sec. O2 being the reactant gas and also the purge gas was constantly introduced at 200 sccm. The precursor supply was stopped and the purge process was provided (for 0.4 sec) while the O2 (as the purge gas) and Ar (as the seal gas) were continuously introduced. $O_2$ was introduced now as the reactant gas at 200 sccm for 2.0 sec (the reactant gas supply process), after which the supply of O2 was introduced as the purge gas and the purge process together with the seal gas was implemented (for 0.4 sec). RF (13.56 MHz) power was applied by 40 W in the reactant gas supply process. The RF power was pulse-time-modulated wherein 0.3 sec of RF-ON and 0.1 sec of RF-OFF were alternately repeated five times (a duty of 75%, a time modulated cycle of 0.4 sec). For comparison purposes, a similar operation was performed without pulse-time-modulation of the RF power in the reactant gas supply process, i.e., applying the RF power for 2.0 sec. The above sequential processes constituting one main cycle were repeated 1,237 times to form on the wafer a film targeting a thickness of 150 nm (the thickness of the resultant film deposited with the pulse-time modulation was 138 nm, and the thickness of the resultant film deposited without pulse-time modulation was 148 nm).

Figure 6:
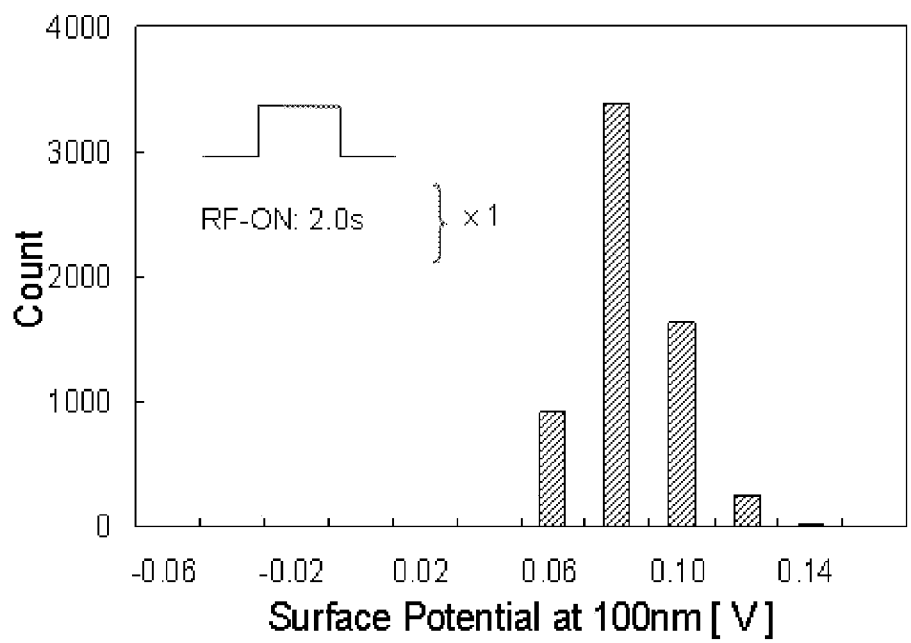
FIG. 6 is a histogram showing distributions of surface potential (V) of the resultant wafer as calculated per film thickness of 100 nm, when the RF power was not pulse-time-modulated.

FIG. 6 is a histogram showing distributions of surface potential (V) of the resultant wafer (measuring 6,210 points on the wafer surface) as calculated per film thickness of 100 nm, when the RF power was not pulse-time-modulated. The average surface potential was as high as 73.9 mV.

Figure 7:
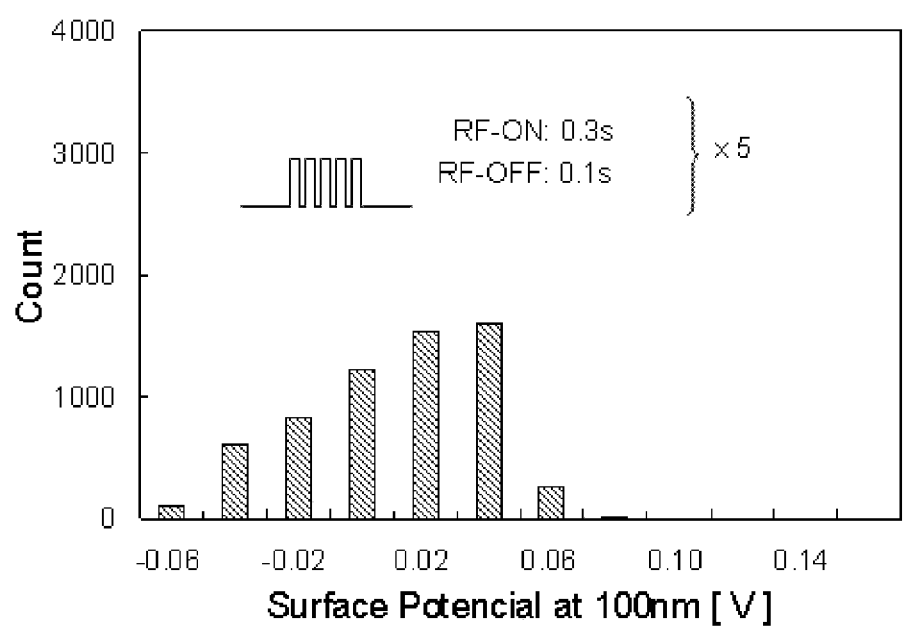
FIG. 7 is a histogram showing distributions of surface potential (V) of the resultant wafer as calculated per film thickness of 100 nm, when the RF power was pulse-time-modulated.

FIG. 7 is a histogram showing distributions of surface potential (V) of the resultant wafer (measuring 6,210 points on the wafer surface) as calculated per film thickness of 100 nm, when the RF power was pulse-time-modulated. The average surface potential decreased to a level as low as 0.8 mV (in some embodiments, the average surface potential is in a range of −10 mV to 30 mV, typically 0 mV to 20 mV). Although the theory is not intended to limit the invention, this may be because the surface potential generated during the film formation was dissipated by negative ions created during the time period of RF-OFF. A skilled artisan would reasonably expect that based on the substantial reductions of surface potential, wafer-slipping and -adhering problems would be substantially mitigated (For example, JP 1991-044472 addresses the static electricity on a wafer surface and a sticking problem).

Further, the wafers processed with the pulse-time-modulated RF power show excellent in-plane film uniformity (the in-plane uniformity was calculated from 49-point measurements on the wafer). The table below shows the results.

TABLE 1

| In-Plane Uniformity | |
| --- | --- |
| Comparative ALD Process [%] | Pulse-Time-Modulated ALD Process [%] |
| 3.730 | 1.300 |

Although in this example, the in-plane film uniformity was 1.3%, by using pulse-time-modulated RF power, in-plane film uniformity can be controlled at 2.0% or less, typically 1.5% or less in some embodiments.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method of depositing a film by atomic layer deposition (ALD) with pulse-time-modulated plasma, comprising:
   introducing a precursor gas in pulses over a substrate;
   introducing a reactant gas over a substrate; and
   applying pulse-time-modulated RF power in pulses onto the substrate, wherein a main pulse of the pulse-time-modulated RF power is applied onto the substrate during intervals between two consecutive pulses of the precursor gas while the reactant gas is being introduced and no pulse of the pulse-time-modulated RF power is applied onto the substrate during the pulses of the precursor gas,
   wherein the main pulse of the pulse-time-modulated RF power is comprised of a plurality of secondary pulses of RF power wherein one cycle of each secondary pulse is about 3 milliseconds (msec) to about 1,000 msec, and a duty of the cycle is about 60% or higher, wherein a duration of no RF power period between two consecutive secondary pulses of RF power is about 1 msec to about 300 msec.

2. The method according to claim 1, wherein the reactant gas is introduced in pulses.

3. The method according to claim 1, wherein the main pulse of the pulse-time-modulated RF power has a duration of about 0.1 sec to about 10 sec, and an interval between two consecutive main pulses of the pulse-time-modulated RF power is about 0.3 sec to about 5 sec.

4. The method according to claim 1, wherein one cycle of each secondary pulse is about 40 msec to about 600 msec.

5. The method according to claim 1, wherein the duty of the cycle of each secondary pulse is about 75% or higher.

6. The method according to claim 1, wherein one cycle of each secondary pulse is about 8 msec to about 1,000 msec, and a duty of the cycle is about 60% or higher.

7. The method according to claim 6, wherein the one cycle of each secondary pulse is about 100 msec to about 500 msec, and a duty of the cycle is about 75% or higher.

8. The method according to claim 2, wherein in one cycle of introducing the precursor over the substrate and in one cycle of introducing the reactant gas, a duration of flow of the precursor is 0.2 to 5 seconds, a duration of flow of the reactant gas is 0.2 to 5 seconds, and an interval between the precursor flow and the reactant gas flow is 0.2 to 5 seconds.

9. The method according to claim 1, wherein the reactant gas is continuously supplied in the precursor adsorption process.

10. The method according to claim 1, wherein a purge process is provided between the precursor adsorption process and plasma treatment process using a reactant gas.

11. The method according to claim 1, wherein the precursor is at least one type of material selected from the group that includes silicon.

12. The method according to claim 1, wherein the thin film is constituted by a silicon compound.

13. The method according to claim 1, wherein the reactant gas is $NO_2$, $O_2$, $H_2$, $CO_2$, $N_2O$, $N_2$ and/or $NH_3$.

14. The method according to claim 1, wherein the precursor is a gas having an aminosilane group.

15. The method according to claim 1, wherein the thin film is constituted by a metal oxide compound or metal oxide composite.

16. The method according to claim 11, wherein the thin film is constituted by SiO, SiN, SiC, SiON, SiCON, SiCO, SiBN, SiBO or SiCN.

17. The method according to claim 1, wherein the RF power generating the plasma in is less than 0.7 $W/cm^2$ per area of the substrate.

18. The method according to claim 1, wherein the process pressure in the process of forming the film is in a range of 50 to 2000 Pa.

19. The method according to claim 1, wherein the plasma is generated in a gap between capacitively-coupled parallel plate electrodes.

20. The method according to claim 1, wherein the duration of RF power period between two consecutive secondary pulses of RF power is about 30 msec to about 150 msec.

* * * * *